(12) United States Patent
Moriya et al.

(10) Patent No.: US 9,012,331 B2
(45) Date of Patent: Apr. 21, 2015

(54) ETCHING METHOD AND NON-TRANSITORY STORAGE MEDIUM

(71) Applicants: Tokyo Electron Limited, Tokyo (JP); L'Air Liquide, Societe Anonyme pour l'Etude et l'Exploitation des Procedes Georges Claude, Paris Cedex (FR)

(72) Inventors: Shuji Moriya, Nirasaki (JP); Atsushi Ando, Nirasaki (JP); Jun Sonobe, Tsukuba Ibaraki (JP); Christopher Turpin, Tsukuba Ibaraki (JP)

(73) Assignees: L'Air Liquide Societe Anonyme pour l'Etude et l'Exploitation des Procedes Georges Claude, Paris Cedex (FR); Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/290,036

(22) Filed: May 29, 2014

(65) Prior Publication Data

US 2014/0357085 A1    Dec. 4, 2014

(30) Foreign Application Priority Data

May 31, 2013   (JP) ................ 2013-115577

(51) Int. Cl.
*H01L 21/302*  (2006.01)
*H01L 21/461*  (2006.01)
*H01L 21/306*  (2006.01)
*H01L 21/67*   (2006.01)

(52) U.S. Cl.
CPC ........ *H01L 21/306* (2013.01); *H01L 21/67069* (2013.01)

(58) Field of Classification Search
USPC ............................................ 438/706; 216/79
See application file for complete search history.

(56) References Cited

U.S. PATENT DOCUMENTS

2008/0142039 A1* 6/2008 Chen et al. ............... 134/1.2

FOREIGN PATENT DOCUMENTS

| JP | 2005-039185 | 2/2005 |
| JP | 2008-160000 | 7/2008 |

* cited by examiner

*Primary Examiner* — Roberts Culbert
(74) *Attorney, Agent, or Firm* — Nath, Goldberg & Meyer; Jerald L. Meyer (57) ABSTRACT

Provided is a method of selectively etching a portion of silicon existing on a surface of a substrate to be processed, which includes: loading the substrate to be processed into a chamber; and supplying an FNO gas and an $F_2$ gas that are diluted with an inert gas into the chamber such that the FNO gas and the $F_2$ gas are reacted with the portion of silicon existing on the surface of the substrate to be processed.

13 Claims, 6 Drawing Sheets

ETCHING METHOD AND NON-TRANSITORY STORAGE MEDIUM

CROSS-REFERENCE TO RELATED APPLICATION

This application claims the benefit of Japanese Patent Application No. 2013-115577, filed on May 31, 2013, in the Japan Patent Office, the disclosure of which is incorporated herein in its entirety by reference.

TECHNICAL FIELD

The present disclosure relates to a method of etching a portion of silicon existing on a substrate and a non-transitory storage medium.

BACKGROUND

In recent years, in manufacturing a semiconductor device, a non-plasma dry etching technique called a chemical oxide removal (COR) has been focused as a miniaturization etching technique substituted for a dry etching or a wet etching. Only a hydrogen fluoride (HF) gas or a mixed gas of the HF gas and an ammonia ($NH_3$) gas has been used in etching an oxide such as a silicon oxide ($SiO_2$).

The COR technique is used to etch the oxide such as the silicon oxide ($SiO_2$), but in recent years, is under consideration as a way to etch a portion of silicon (Si) contained in a polysilicon (poly-Si) film or the like. The polysilicon film, together with other films such as a silicon nitride (SiN) film, is formed on a semiconductor wafer (or a silicon wafer) used as a substrate to be processed. As such, the polysilicon film is required to be etched at a high etching selectivity compared to the SiN film or the like. From such a point of view, a mixed gas of HF gas+$F_2$ gas is under consideration as a gas for etching the portion of silicon (Si) using the non-plasma dry etching technique.

However, etching the portion of silicon (Si) using the mixed gas of HF gas+$F_2$ gas results in a considerable reduction in etching rate, which makes it difficult to employ as a mass production technology.

SUMMARY

Some embodiments of the present disclosure provide to a method which is capable of etching a portion of silicon existing on a substrate to be processed at a high etching rate and a high etching selectivity using a non-plasma dry etching technique and a non-transitory storage medium.

According to one embodiment of the present disclosure, provided is a method of selectively etching a portion of silicon existing on a surface of a substrate to be processed, the method including: loading the substrate to be processed into a chamber; and supplying an FNO gas and an $F_2$ gas that are diluted with an inert gas into the chamber such that the FNO gas and the $F_2$ gas are reacted with the portion of silicon existing on the surface of the substrate to be processed.

According to another embodiment of the present disclosure, provided is a non-transitory storage medium having a control program that operates on a computer and controls an etching apparatus stored thereon, wherein the control program, when executed, causes the computer to perform the aforementioned method using the etching apparatus.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

An embodiment of the present disclosure will now be described in detail with reference to the drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

The present inventors studied the foregoing and have found that an etching rate of a silicon compound greatly depends on conditions applied in an etching process, that is, a temperature, pressure, and densities of FNO and $F_2$ gases.

The FNO gas, which deeply contributes to the etching of the silicon compound, has a tendency that the higher the density of the FNO gas, the higher the etching rate, and the higher the pressure and the temperature, the higher the etching rate. Such a tendency depends on an object to be etched. Accordingly, it is necessary to optimize the process conditions to obtain a higher etching selectivity.

As described above, it is assumed that the polysilicon film is etched at the high etching selectivity compared to the silicon nitride film. The use of gas according to this embodiment enables the polysilicon film to be etched at a high speed. It is hard to etch the silicon nitride film compared to the polysilicon film, but under conditions of a high temperature (more than 200 degrees C.) and a high density (partial pressure more than 1 Torr) of the FNO gas, the silicon nitride film is rapidly etched. The present inventors examined this discovery and found that there are conditions in which only the polysilicon film is selectively etched without etching the silicon nitride film.

<Processing System>

Figure 1:
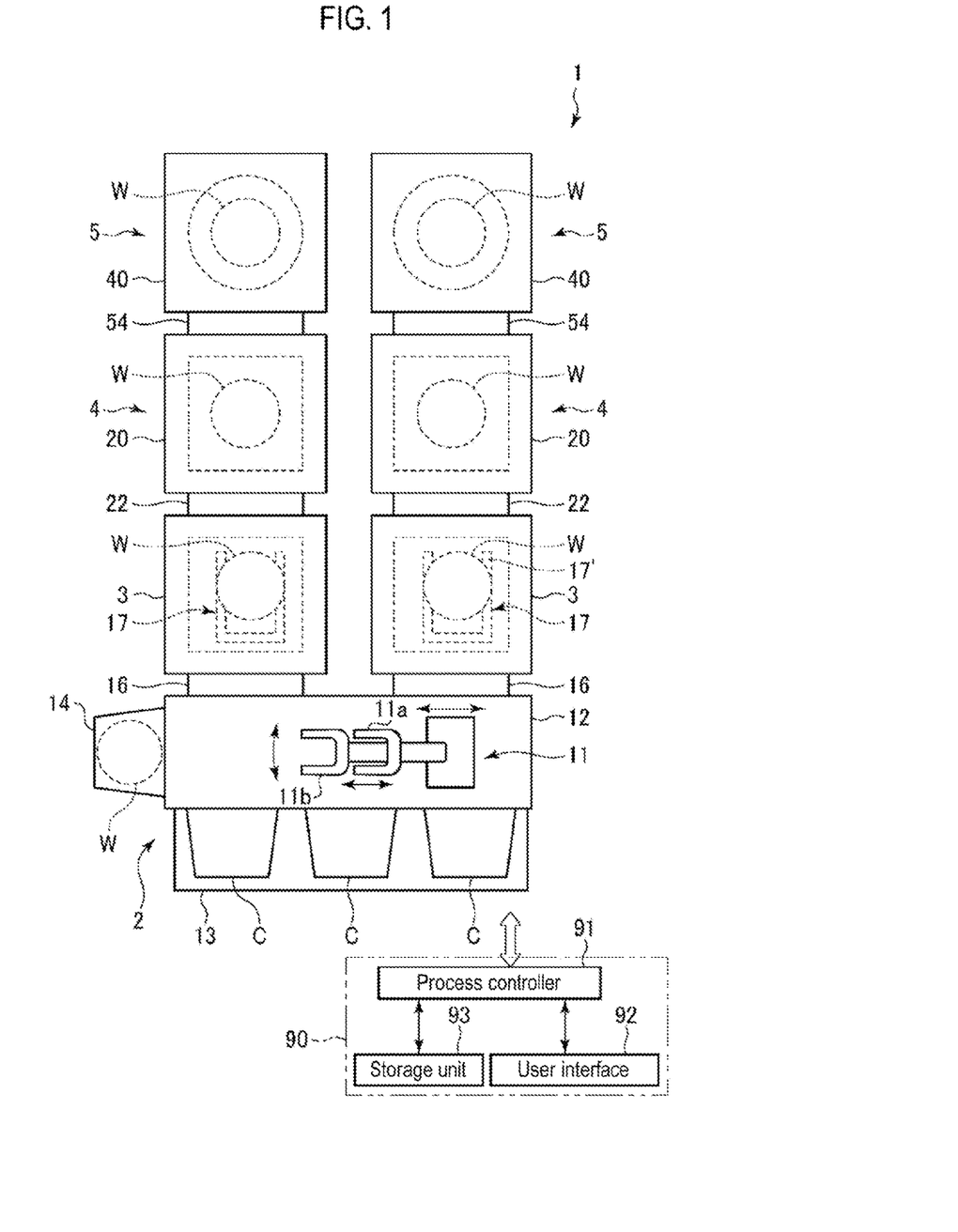
FIG. 1 is a view showing a schematic configuration of a processing system including an etching apparatus which is used to perform an etching method according to an embodiment of the present disclosure.

FIG. 1 is a view showing a schematic configuration of a processing system including an etching apparatus which is used to perform an etching method according to an embodiment of the present disclosure. The processing system 1 includes a loading/unloading unit 2 configured to load and unload a semiconductor wafer (hereinafter, simply referred to as a "wafer") W, two load lock chambers 3 disposed adjacent to the loading/unloading unit 2, two post heat treatment ("PHT") apparatuses 4 which are disposed adjacent to each of the load lock chambers 3 and are configured to perform a post heat treatment on the wafer W, and two etching apparatuses 5 which are disposed adjacent to each of the PHT apparatuses 4 and are configured to perform a non-plasma etching on the wafer W. The load lock chambers 3, the PHT apparatuses 4, and the etching apparatuses 5 are aligned in that order side by side.

The loading/unloading unit 2 includes a transfer chamber 12 in which a first wafer transfer mechanism 11 configured to transfer the wafer W is disposed. The first wafer transfer mechanism 11 includes two transfer arms 11a and 11b which approximately horizontally hold the wafer W. A mounting table 13 is disposed in a side of the transfer chamber 12 in a longitudinal direction. On the mounting table 13, a plurality of (e.g., three) carriers C is mounted side by side. Each of the carriers C is capable of accommodating the wafers W and is connected to the side of the transfer chamber 12. In addition, an orienter 14 is installed adjacent to the transfer chamber 12. The orienter 14 rotates the wafer W, optically measures an eccentric amount of the rotation, and performs a positioning operation.

In the loading/unloading unit 2, the wafer W is moved by an operation of the first wafer transfer mechanism 11 in horizontal and vertical directions while being held by the transfer arms 11a and 11b so that the wafer W is transferred to a desired position. In addition, the wafer W is transferred between the respective carrier C mounted on the mounting table 13, the orienter 14, and the respective load lock chamber 3 by horizontal and vertical movements of the transfer arms 11a and 11b.

Each of the load lock chambers 3 is connected to the transfer chamber 12 through a respective gate valve 16 interposed therebetween. Each of the load lock chambers 3 includes a second wafer transfer mechanism 17 configured to transfer the wafer W. The load lock chambers 3 are configured to be evacuated to a predetermined degree of vacuum.

Each of the second wafer transfer mechanisms 17, which has a multi-joint arm structure, is equipped with picks 17' that approximately horizontally hold the wafer W. In the second wafer transfer mechanism 17, the picks 17' are located inside the load lock chamber 3 by shortening the multi-joint arm, and enter into the PHT apparatus 4 by extending the multi-joint arm. Further, the picks 17' reach the etching apparatus 5 by further extending the multi-joint arm. In this way, the wafer W is transferred between the load lock chambers 3, the PHT apparatuses 4, and the etching apparatuses 5.

Figure 2:
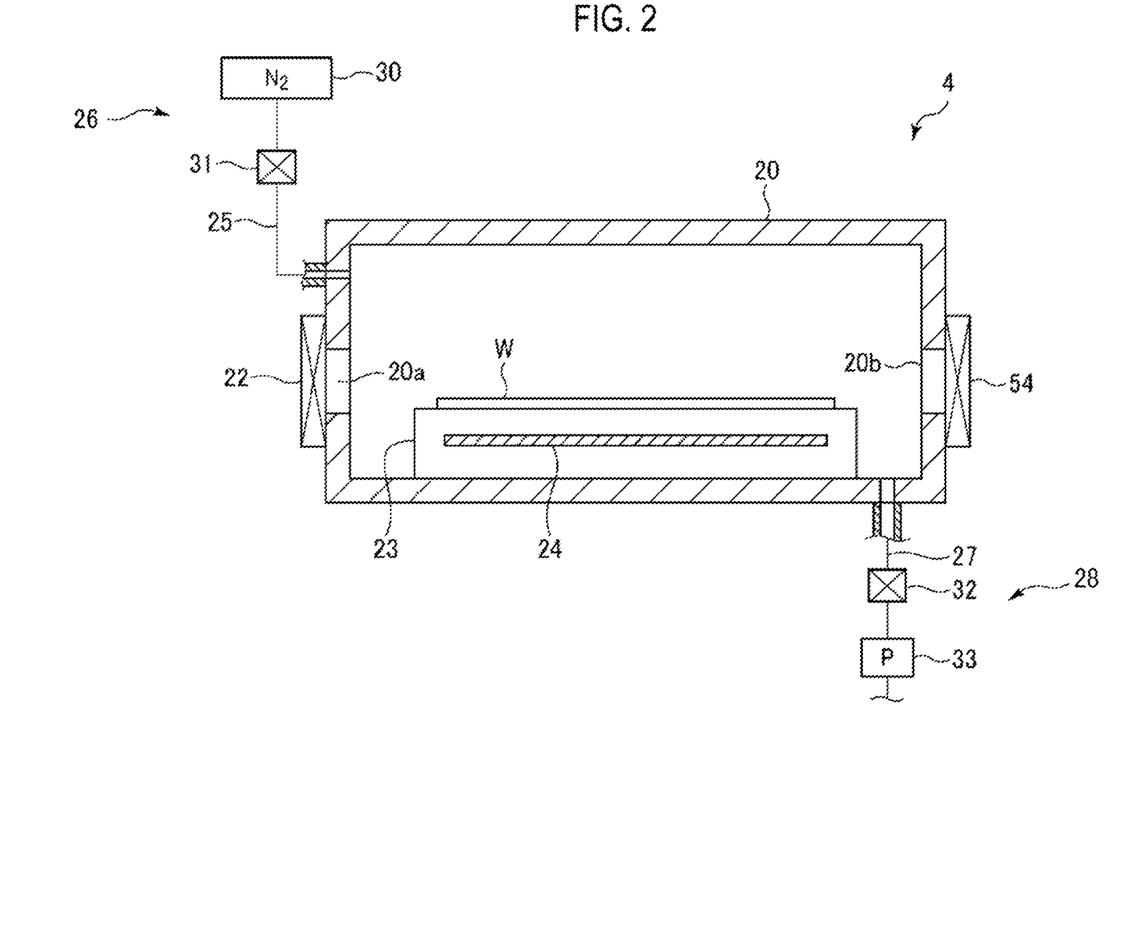
FIG. 2 is a cross-sectional view showing a PHT (post heat treatment) processing apparatus provided in the processing system of FIG. 1.

As shown in FIG. 2, the PHT apparatus 4 includes an evacuable chamber 20, and a mounting table 23 which is disposed inside the evacuable chamber 20 and mounts the wafer W thereon. Inside the mounting table 23, a heater 24 is installed to perform the post heat treatment (PHT) of heating the wafer W which has been subjected to the etching process, and vaporizing (sublimating) reaction products generated by the etching process. In a side facing the load lock chamber 3 in the chamber 20, an inlet/outlet 20a through which the wafer W is transferred between the chamber 20 and the load lock chamber 3, is formed. The inlet/outlet 20a is opened and closed by a gate valve 22. In addition, in a side facing the etching apparatus 5 in the chamber 20, an inlet/outlet 20b through which the wafer W is transferred between the chamber 20 and the etching apparatus 5, is formed. The inlet/outlet 20b is opened and closed by a gate valve 54. Further, the PHT apparatus 4 includes a gas supply mechanism 26 which is configured to supply an inert gas such as a nitrogen gas ($N_2$) into the chamber 20 through a gas supply line 25, and an exhaust mechanism 28 which is configured to exhaust the interior of the chamber 20 through an exhaust line 27. The gas supply line 25 is connected to a nitrogen gas supply source 30. In addition, in the gas supply line 25, a flow adjusting valve 31 which is configured to open/close the gas supply line 25 so as to control a supply flow rate of the nitrogen gas, is provided. The exhaust mechanism 28 includes an opening/closing valve 32 and a vacuum pump 33 which are connected to the exhaust line 27.

Figure 3:
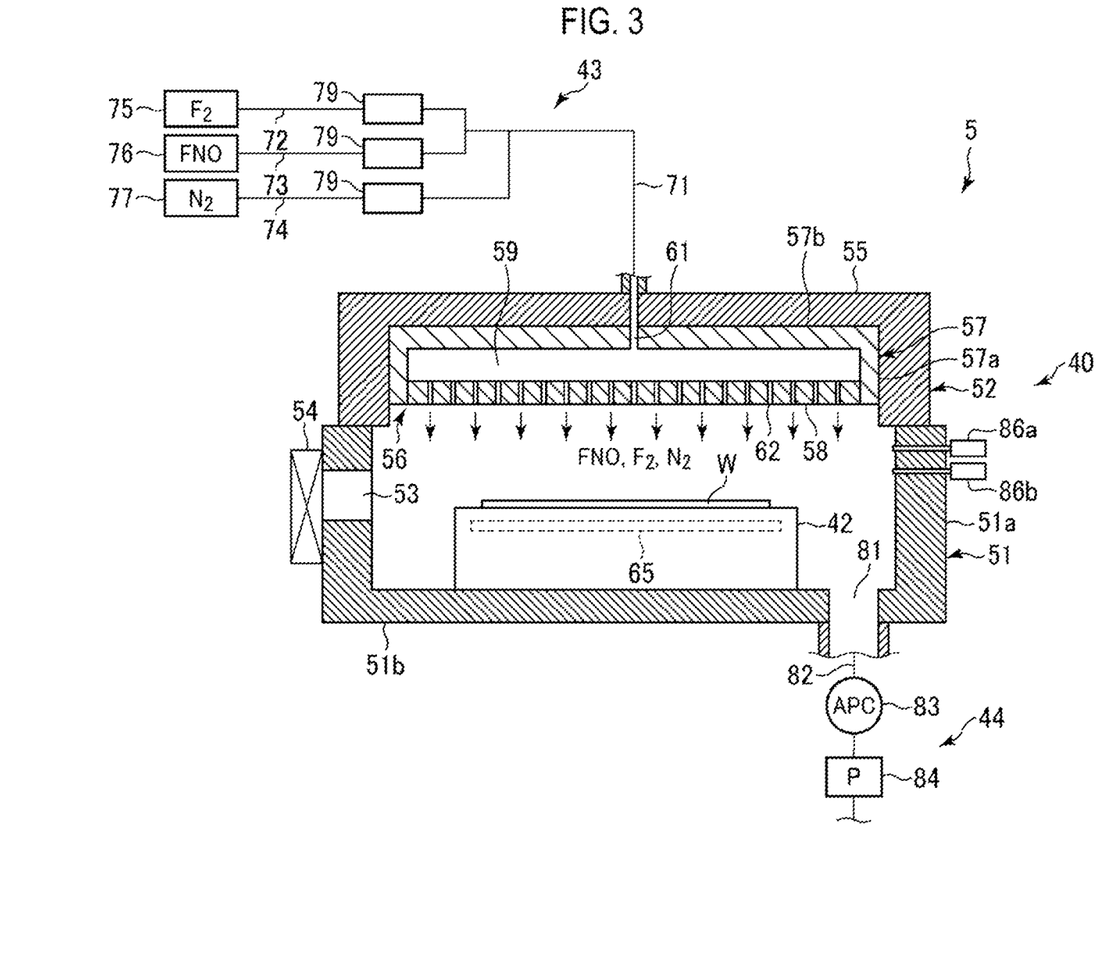
FIG. 3 is a cross-sectional view showing a schematic configuration of an example of the etching apparatus provided in the processing system of FIG. 1.

As shown in FIG. 3, the etching apparatus 5 includes an airtight chamber 40. A mounting table 42 which is configured to approximately horizontally mount the wafer W thereon, is disposed inside the chamber 40. Further, the etching apparatus 5 includes a gas supply mechanism 43 configured to supply an FNO gas, an $F_2$ gas, and an $N_2$ gas into the chamber 40, and an exhaust mechanism 44 configured to exhaust the interior of the chamber 40.

The chamber 40 includes a chamber main body 51 and a lid part 52. The chamber main body 51 includes a substantially cylindrical side wall portion 51a and a bottom portion 51b. An upper portion of the chamber main body 51 is opened, and the opened portion is closed by the lid part 52. The side wall portion 51a and the lid part 52 are sealed by a sealing member (not shown), thus maintaining airtightness of the chamber 40.

An inlet/outlet 53 through which the wafer W is transferred into the chamber 20 of the PHT apparatus 4 is formed in the side wall portion 51a. The inlet/outlet 53 is opened and closed by the gate valve 54.

The lid part 52 includes a lid member 55 as an outer member, and a shower head 56 as an inner member which is fitted into the lid member 55 and is disposed to face the mounting table 42. The shower head 56 includes a main body 57 having a cylindrical side wall 57a and a top wall 57b, and a shower plate 58 disposed in a bottom portion of the main body 57. The main body 57 and the shower plate 58 define a space 59 therebetween.

A gas introduction passage 61 which penetrates through both the lid member 55 and the top wall 57b of the main body 57, is formed to reach the space 59. The gas introduction passage 61 is connected to a gas supply pipe 71 of the gas supply mechanism 43.

A plurality of gas discharge holes 62 is formed in the shower plate 58. Gases introduced into the space 59 through the gas supply pipe 71 and the gas introduction passage 61 are flown into the chamber 40 through the gas discharge holes 62.

The mounting table 42, which is of a substantially circular shape as viewed from the top, is fixed to the bottom portion 51b of the chamber 40. A temperature controller 65 configured to control a temperature of the mounting table 42 is embedded into the mounting table 42. The temperature controller 65 includes a pipe line through which a temperature control medium (e.g., water) circulates. Ambient air is exchanged with the temperature control medium flowing through the pipe line so that the temperature of the mounting table 42 is controlled, thus controlling a temperature of the wafer W mounted on the mounting table 42.

The gas supply mechanism 43 includes an $F_2$ gas supply source 75, an FNO gas supply source 76, and an $N_2$ gas supply source 77. The $F_2$ gas supply source 75, the FNO gas supply source 76 and the $N_2$ gas supply source 77 are connected to an $F_2$ gas supply pipe 72, an FNO gas supply pipe 73 and an $N_2$ gas supply pipe 74, respectively. The $F_2$ gas supply pipe 72, the FNO gas supply pipe 73 and the $N_2$ gas supply pipe 74 are connected to the gas supply pipe 71 through respective flow rate controllers 79 interposed therebetween, respectively. The flow rate controllers 79 open and close the pipes 71, 72, 73 and 74 to control flow rates of the gases flowing therethrough. Each of the flow rate controllers 79 is equipped with, e.g., an opening/closing valve and a mass flow controller.

The $F_2$ gas and the FNO gas, which are supplied from the $F_2$ gas supply source 75 and the FNO gas supply source 76 at a predetermined flow rate, are mixed within the gas supply pipe 71. Subsequently, the mixed gas is supplied into the shower head 56 through the gas supply pipe 71 together with the $N_2$ gas. The mixed gas and the $N_2$ gas are discharged into the chamber 40 through the gas discharge holes 62 of the shower head 56.

Among the above gases, the FNO gas and the $F_2$ gas are used as a reaction gas, and the $N_2$ gas as the inert gas is used as a dilution gas. The predetermined flow rate of the FNO gas and the $F_2$ gas used as the reaction gas are diluted with the $N_2$ gas used as the dilution gas, followed by being introduced into the chamber 40. Then, the inside of the chamber 40 is kept at a predetermined pressure and simultaneously, the portion of Si (e.g., the poly-Si film) existing on the wafer W is etched. The FNO gas may be produced by reaction of the $F_2$ gas with the NO gas.

An example of the inert gas used as the dilution gas may include an argon (Ar) gas, a helium (He) gas or the like, in addition to the $N_2$ gas. Further, the $N_2$ gas, the Ar gas, and the He gas may be independently used, or two kinds or more thereof may be used. Other dilution gases may be used.

In addition, since the $F_2$ gas stored in the $F_2$ gas supply source 75 which is made of, typically, a tank construction, has very high activity, the $F_2$ gas is required to be diluted by the inert gas such as the $N_2$ gas at a volume ratio of $F_2:N_2=1:4$.

The exhaust mechanism 44 includes an exhaust pipe 82 which is connected to an exhaust port 81 formed in the bottom portion 51b of the chamber 40. The exhaust mechanism 44 further includes an automatic pressure control valve (APC) 83, and a vacuum pump 84 configured to exhaust the interior of the chamber 40. The APC 83 is disposed in the exhaust pipe 82 to control an internal pressure of the chamber 40.

Two capacitance manometer 86a and 86b used as pressure gauges, which are configured to measure the internal pressure of the chamber 40, are disposed to be inserted into the side wall portion 51a of the chamber 40. The capacitance manometer 86a is to measure a high pressure, while the capacitance manometer 86b is to measure a low pressure.

Aluminum (Al) is used as a material of various components such as the chamber 40, the mounting table 42 and the like which constitute the etching apparatus 5. The aluminum material constituting the chamber 40 may be a pure material. In some embodiments, surfaces (including an inner surface of the chamber main body 51, a lower surface of the shower head 56 or the like) may be subjected to an anodic oxidation treatment. Further, since a surface of the aluminum constituting the mounting table 42 requires resistance to wear, in some embodiments, the surface is subjected to the anodic oxidation treatment so that an anodic oxidized film ($Al_2O_3$) having a high wear resistance is formed thereon.

As shown in FIG. 1, the processing system 1 includes a control unit 90. The control unit 90 includes a process controller 91 equipped with a microprocessor (or a computer) that controls respective components of the processing system 1. The process controller 91 is connected to a keyboard (not shown) for allowing an operator to perform input manipulation such as command input and so on for management of the processing system 1, and a user interface 92 composed of a display or the like for displaying an operation state of the processing system 1. The process controller 91 is also connected to a storage unit 93 to store control programs for realizing various processes including the supply of the process gas, the exhaust of the chamber 40 or the like in the etching apparatus 5, which are to be executed in the processing system 1 under control of the process controller 91; and control programs, i.e., process recipes, for causing various components of the processing system 1 to perform their respective processes depending on their respective processing conditions. The storage unit 93 may store various databases. The processing recipes are stored in a storage medium in the storage unit 93. If necessary, any process recipe may be called from the storage unit 93 and then executed by the process controller 91 so that a desired process can be performed in the processing system 1 under the control of the process controller 91.

<Etching Method>

Next, an etching method using the processing system 1 according to one embodiment will be described.

First, there are prepared a plurality of wafers W on each of which a poly-Si film having a portion of Si (as an object to be etched), a SiN film as a hard mask film and a TiN film as an electrode are formed. The SiN film and the TiN film are formed adjacent to the poly-Si film. The plurality of wafers W are transferred to the processing system 1 in a state where they are received in the respective carrier C. In the processing system 1, one of the wafers W is picked up by any of the transfer arms 11a and 11b of the first wafer transfer mechanism 11, and is transferred from the carrier C of the loading/unloading unit 2 to the respective load lock chamber 3. At this time, the gate valve 16 is opened to be in an atmospheric state. Subsequently, the wafer W is conveyed to the picks 17' of the second wafer transfer mechanism 17 in the load lock chamber 3.

Thereafter, the gate valve 16 is closed and the interior of the load lock chamber 3 is evacuated. Subsequently, the gate valves 22 and 54 are opened and the picks 17' are extended up to the respective etching apparatus 5 such that the wafer W is mounted on the mounting table 42.

Thereafter, the picks 17' return to the load lock chamber 3 and the gate valve 54 is closed, making the interior of the chamber 40 airtight. In this state, the temperature of the wafer W mounted on the mounting table 42 is controlled to a predetermined target temperature by the temperature controller 65. Then, the $F_2$ gas, the FNO gas and the $N_2$ gas are supplied from the $F_2$ gas supply source 75, the FNO gas supply source 76 and the $N_2$ gas supply source 77 of the gas supply mechanism 43. As described above, the $F_2$ gas and the FNO gas are mixed with each other within the gas supply pipe 71. The mixed gas together with the $N_2$ gas (the inert gas) used as the dilution gas, are introduced into the space 59 of the shower head 56 and subsequently, are discharged into a space formed in the chamber 40 through the gas discharge holes 62.

The portion of Si (e.g., the poly-Si film) existing on the wafer W is etched by an etching gas, i.e., the mixed gas of the FNO gas and the $F_2$ gas.

The mixed gas of FNO and $F_2$ has very high reactivity to the Si, thus etching the Si at a very high etching rate even in a low density. For example, when etching the poly-Si film having a thickness of 150 nm, a period of time spent in etching using a mixed gas of an NF gas and the $F_2$ gas was measured as about 40 minutes, while that in etching using the mixed gas of the FNO gas and the $F_2$ gas was measured as about 2 minutes. Accordingly, the etching of the poly-Si film using the mixed gas of the FNO gas and the $F_2$ gas can be performed at an etching rate of about 20 times compared to the case where the mixed gas of the NF gas and the $F_2$ are used.

Meanwhile, the mixed gas of the FNO gas and the $F_2$ gas etches the SiN film, the TiN film and the like (which are formed adjacent to the poly-Si film) at a low etching rate, which makes it possible to etch the poly-Si film at very high etching selectivity compared to the SiN film and the TiN film.

As an example, the etching selectivity of the poly-Si film to the SiN film may fall within a range of 100 to infinity.

In some embodiments, a density of the FNO gas is in a range of 0.5 to 3.0% in volume ratio. Further, a density of the $F_2$ gas may be in a range of 0.01 to 3.0% in the volume ratio. In alternate embodiments, the volume ratio between the FNO gas and the $F_2$ gas may set to be in a range of FNO:$F_2$=30:1 to 1:1. Further, the volume ratio between the etching gas (FNO+$F_2$) and the inert gas (used as the dilution gas), which depends on the size of an object to be etched, may be set to be in a range of 1:150 to 1:10.

During the etching process, a temperature of the wafer W mounted on the mounting table 42 may be set to be in a range of 50 to 200 degrees C. Further, an internal pressure of the chamber 40 may be set to be in a range of 1 to 100 Torr (133.3 to 13330 Pa).

In addition, both the FNO and $F_2$ gases have a low boiling point so that they exist stably as a gas under normal processing conditions.

During the etching process as described above, the reaction products such as SiF or the like are produced, which adhere to the surface of the wafer W.

Therefore, upon completing the etching process using the etching apparatus 5, the wafer W is transferred to the PHT apparatus 4 where the wafer W is heated to remove the reaction products that adhere to the surface thereof. Specifically, upon completing the etching process by the etching apparatus 5, the gate valves 22 and 54 are opened, and the wafer W (which has been subjected to the etching process) mounted on the mounting table 42 is picked up by the picks 17' of the second wafer transfer mechanism 17, followed by being transferred to and mounted on the mounting table 23 disposed inside the chamber 20 of the PHT apparatus 4. Subsequently, the picks 17' are retracted to the load lock chamber 3 and the gate valves 22 and 54 are closed. Simultaneously, the $N_2$ gas is introduced into the chamber 20 and the wafer W mounted on the mounting table 23 is heated by the heater 24. Thus, the reaction products produced during the etching process are heated and vaporized for removal.

Subsequently, upon completing the heating treatment by the PHT apparatus 4, the gate valve 22 is opened and the wafer W (which has been subjected to the heating treatment) mounted on the mounting table 23 is transferred to the load lock chamber 3 by the picks 17' of the second wafer transfer mechanism 17. Thereafter, the wafer W is transferred to the carrier C by any of the transfer arms 11a and 11b of the first wafer transfer mechanism 11. Thus, a sequence of the above processes for one sheet of the wafer W is completed.

As described above, according to the above embodiment, the portion of Si (e.g., the poly-Si film) formed on the wafer W is etched by the etching gas obtained by mixing the FNO and $F_2$ gases and the dilution gas consisting of an inert gas such as the $N_2$ gas through the use of the etching apparatus 5. Thus, it is possible to etch the portion of Si at a very high etching rate and a high etching selectivity compared to the adjacent films such as the SiN film and the TiN film.

Figure 4:
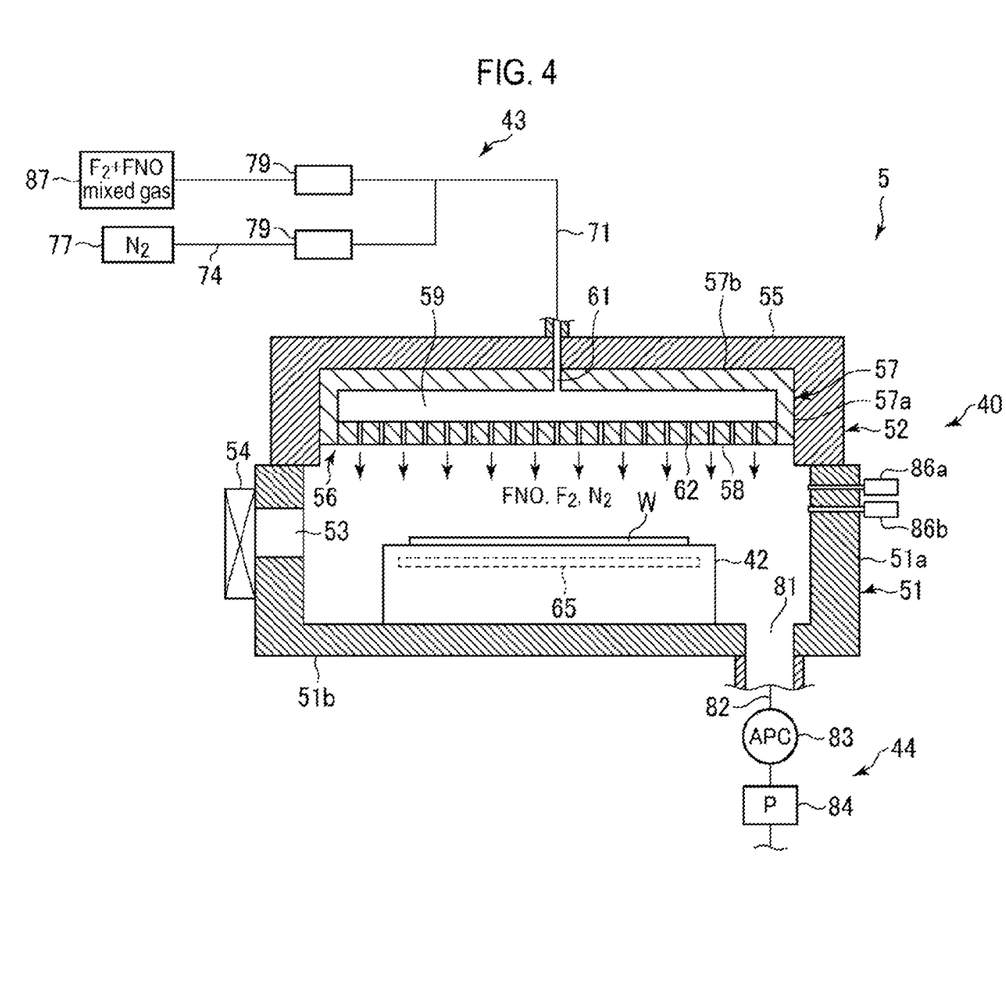
FIG. 4 is a cross-sectional view showing a schematic configuration of another example of the etching apparatus.

In some embodiments, in the gas supply mechanism 43, when the ratio of the $F_2$ gas to the FNO gas is previously determined, as shown in FIG. 4, a mixed gas supply source 87 configured to supply a mixed gas of $F_2$ and FNO gases may be disposed instead of both the $F_2$ gas supply source 75 and the FNO gas supply source 76. Alternatively, both the mixed gas supply source 87 and the $F_2$ gas supply source 75 may be used. In FIG. 4, the mixed gas supply source 87 is directly connected to the gas supply pipe 71.

Figure 5:
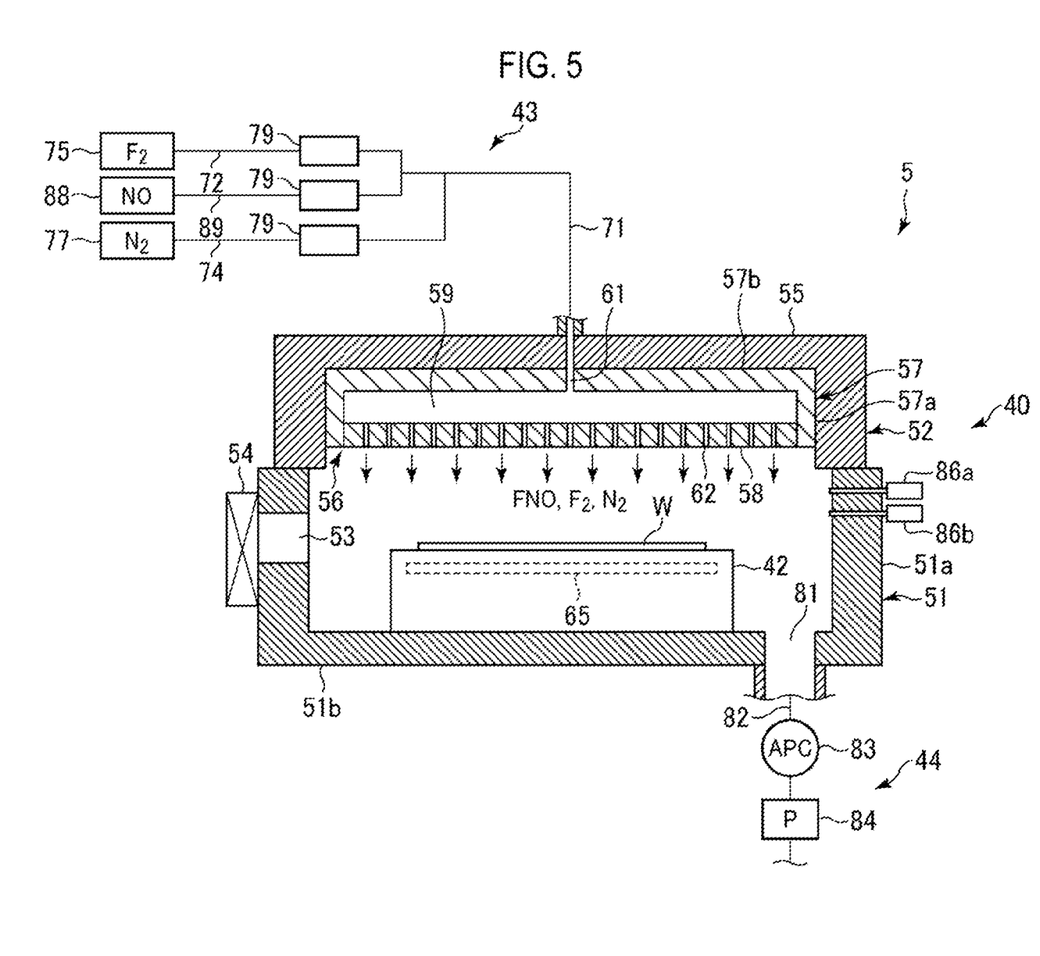
FIG. 5 is a cross-sectional view showing a schematic configuration of a further example of the etching apparatus.

In some embodiments, as shown in FIG. 5, in the gas supply mechanism 43, a NO gas supply source 88 may be used instead of the FNO gas supply source 76. In this case, the $F_2$ gas and the NO gas are mixed and react with each other within the gas supply pipe 71. The $F_2$ gas is supplied in excess of a stoichiometric composition of the FNO gas so that the mixed gas of the FNO gas and the $F_2$ gas is formed. Subsequently, the FNO gas and the $F_2$ gas together with the $N_2$ gas are supplied into the shower head 56 via the gas supply pipe 71, followed by being discharged into the chamber 40 through the gas discharge holes 62. In FIG. 5, a numerical number 89 represents a NO gas supply pipe.

Experimental Example

Next, an experimental example will be described.

Figure 6:
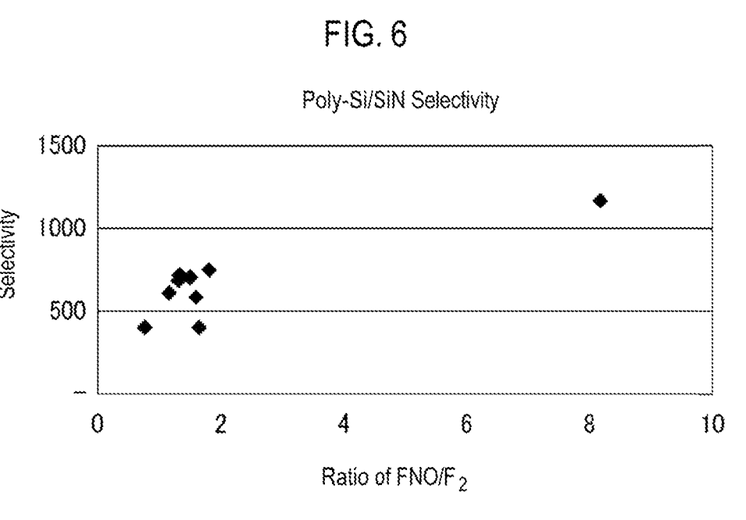
FIG. 6 shows a relationship between a volume ratio of FNO/$F_2$ gases and an etching selectivity of a poly-Si film to a SiN film.

In this experimental example, a plurality of samples are prepared, in which a poly-Si film having a thickness of 200 nm and a SiN film having a thickness of 300 nm are formed on a $SiO_2$ film. Each of the plurality of samples is etched by the $F_2$ gas, the FNO gas, and the $N_2$ gas supplied from the gas supply mechanism 43 of the etching apparatus 5 configured as shown in FIG. 3 while changing a volume ratio of FNO/$F_2$ under conditions in which a temperature of the mounting table 42 is in a range of 50 to 200 degrees C. and an internal pressure of the chamber 40 is in a range of 1 to 100 Torr (133.3 to 13330 Pa). FIG. 6 shows the results obtained by the above experiment as a relationship between the volume ratio of FNO/$F_2$ and an etching selectivity of the poly-Si film to the SiN film. In this experiment, an etched amount was measured at four points of the respective film. As such, an etching rate of the SiN film is very small, which may cause a measurement error. For this reason, the etching selectivity of the poly-Si film to the SiN film was calculated in a state where the etching rate of the SiN film is set to be 0.1 nm/min.

The experiment has shown that, as shown in FIG. 6, it is possible to etch the poly-Si film at a very high etching selectivity compared to the SiN film using the mixed gas of the FNO and $F_2$ gases as the etching gas.

OTHER APPLICATIONS

While certain embodiments have been described, these embodiments have been presented by way of example only, and are not intended to limit the scope of the disclosures. Indeed, the etching methods described herein may be embodied in a variety of other forms. Furthermore, in the above embodiments, the semiconductor wafer has been described to be used as a substrate to be processed, but is not limited thereto. Alternatively, other substrates such as a flat panel display (FPD) substrate represented by a liquid crystal display (LCD) substrate, a ceramic substrate or the like, may be used as the semiconductor wafer.

According to the present disclosure in some embodiments, by diluting FNO and $F_2$ gases with an inert gas, followed by supplying the same into a chamber, followed by reacting the FNO and $F_2$ gases with a portion of silicon on a surface of an substrate to be processed, it is possible to etch the portion of silicon existing on the surface at a high etching rate and at a high selectivity compared to other portions existing on the surface.

While certain embodiments have been described, these embodiments have been presented by way of example only, and are not intended to limit the scope of the disclosures. Indeed, the etching methods described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of selectively etching a portion of silicon existing on a surface of a substrate to be processed, the method comprising:
    loading the substrate to be processed into a chamber; and
    supplying an FNO gas and an $F_2$ gas that are diluted with an inert gas into the chamber such that the FNO gas and the $F_2$ gas are reacted with the portion of silicon existing on the surface of the substrate to be processed.

2. The method of claim 1, wherein the portion of silicon is a polysilicon film.

3. The method of claim 1, wherein the portion of silicon existing on the surface of the substrate to be processed is etched at a high etching selectivity compared to other portions formed adjacent to the portion of silicon.

4. The method of claim 3, wherein the other portion includes a portion of silicon nitride.

5. The method of claim 1, wherein the FNO gas is generated by reaction between the $F_2$ gas and an NO gas.

6. The method of claim 1, wherein a density of the FNO gas is in a range of 0.5 to 3.0% in a volume ratio, and a density of the $F_2$ gas is in a range of 0.01 to 3.0% in a volume ratio.

7. The method of claim 1, wherein a volume ratio of the FNO gas to the $F_2$ gas is in a range of 30:1 to 1:1.

8. The method of claim 1, wherein the inert gas includes at least one selected from a group consisting of a nitrogen ($N_2$) gas, argon (Ar) gas, and helium (He) gas.

9. The method of claim 1, wherein a volume ratio of the sum of the FNO gas and the $F_2$ gas to the inert gas is in a range of 1:150 to 1:10.

10. The method of claim 3, wherein during the etching, a temperature of a mounting table configured to mount the substrate to be processed thereon inside the chamber is set to be in a range of 50 to 200 degrees C.

11. The method of claim 3, wherein during the etching, an internal pressure of the chamber is set to be in a range of 1 to 100 Torr.

12. The method of claim 1, further comprising: after reacting the FNO gas and the $F_2$ gas with the portion of silicon existing on the surface of the substrate to be processed, heating the substrate to be processed inside another chamber to remove reaction products adhered onto the substrate to be processed.

13. A non-transitory storage medium having a control program that operates on a computer and controls an etching apparatus stored thereon,
    wherein the control program, when executed, causes the computer to perform the method of claim 1 using the etching apparatus.

* * * * *